(12) United States Patent
Lepape (10) Patent No.: US 9,362,918 B2
(45) Date of Patent: Jun. 7, 2016

(54) PROGRAMMABLE INTERCONNECTION DEVICE

(71) Applicant: NANOXPLORE, Paris (FR)

(72) Inventor: Olivier Lepape, Paris (FR)

(73) Assignee: NANOXPLORE, Paris (FR)

( * ) Notice: Subject to any disclaimer, the term of this patent is extended or adjusted under 35 U.S.C. 154(b) by 0 days.

(21) Appl. No.: 14/780,431

(22) PCT Filed: Mar. 25, 2014

(86) PCT No.: PCT/FR2014/050692
§ 371 (c)(1),
(2) Date: Sep. 25, 2015

(87) PCT Pub. No.: WO2014/154996
PCT Pub. Date: Oct. 2, 2014

(65) Prior Publication Data
US 2016/0049942 A1    Feb. 18, 2016

(30) Foreign Application Priority Data

Mar. 28, 2013   (FR) ........................ 13 52827

(51) Int. Cl.
*H03K 19/177*   (2006.01)
(52) U.S. Cl.
CPC ...... *H03K 19/17744* (2013.01); *H03K 19/1776* (2013.01); *H03K 19/17704* (2013.01)
(58) Field of Classification Search
None
See application file for complete search history.

(56) References Cited

U.S. PATENT DOCUMENTS

| | | | |
|---|---|---|---|
| 5,452,231 A * | 9/1995 | Butts | G06F 17/5027 326/38 |
| 5,742,181 A | 4/1998 | Rush et al. | |
| 6,014,509 A | 1/2000 | Furtek et al. | |
| 6,289,494 B1 | 9/2001 | Sample et al. | |
| 7,028,281 B1 | 4/2006 | Agrawal et al. | |
| 8,120,382 B2 * | 2/2012 | Bauer | H03K 19/17796 326/38 |

OTHER PUBLICATIONS

P. Search Report dated Aug. 20, 2014 from International Application No. PCT/FR2014/050692 filed Mar. 25, 2014, pp. 1-5.

* cited by examiner

*Primary Examiner* — Ahn Tran
(74) *Attorney, Agent, or Firm* — MH2 Technology Law Group, LLP (57) ABSTRACT

The invention relates to a programmable interconnection device, comprising: first rows of functional blocks, each functional block having inputs and outputs; second rows of programmable interconnection cells; horizontal connections, each connecting a programmable interconnection cell of the second row with only one other cell of that row; and connection bundles comprising transverse connections connecting a given programmable interconnection cell with functional blocks of the neighboring first row; the cells being suitable together for interconnecting the inputs and the outputs of each functional block of each first row with the outputs and the inputs of all of the other functional blocks of the same row.

12 Claims, 6 Drawing Sheets

PROGRAMMABLE INTERCONNECTION DEVICE

CROSS-REFERENCE TO RELATED APPLICATIONS

This application is a U.S. National Stage application of International Application No. PCT/FR2014/050692 filed 25 Mar. 2014, which claims priority to French Application No. 1352827 filed 28 Mar. 2013, the entire disclosures of which are hereby incorporated by reference in their entireties.

BACKGROUND OF THE INVENTION

The present invention relates to the field of integrated circuits and relates more particularly to the architecture of a programmable interconnection device and to the application of such a device to programmable logic circuits such as field-programmable gate network (FPGA) components.

A programmable interconnection device (or system) comprises an electronic circuit enabling interconnection functions to be established between N outputs and M inputs (where N and M are natural integers). Such a programmable interconnection device can thus be connected between the N outputs of a first set of electronic circuits and the M inputs of a second set of electronic circuits so as to establish programmatically the logical connections between a subset of the M outputs of the first set of circuits and a subset of the N inputs of the second set of circuits.

The interconnection function allocates a single output of the first set to each input of the second set. In contrast there is no limit on the number of inputs of the second set that may receive a given output of the first set.

In a manner known, an FPGA circuit is a logic integrated circuit having individual logic blocks that can be assembled together freely. These logic blocks are interconnected with one another using programming, either permanently or reversibly, in order to implement the desired function(s).

A single FPGA circuit can thus be used in different electronic applications. After being programmed, the FPGA circuit behaves like an application specific integrated circuit (ASIC) implementing the logic function(s) established by the programming.

By way of example, a logic block may include a correspondence table or look-up table (LUT) and a "flip-flop".

An FPGA circuit may be organized as a large number of functional blocks, each functional block having a plurality of individual logic blocks so as to be capable of performing particular functions. Like the individual logic blocks, these functional blocks are interconnected by a routing matrix that can be configured by programming. This matrix enables the FPGA component to be reconfigured at will.

Figure 1:
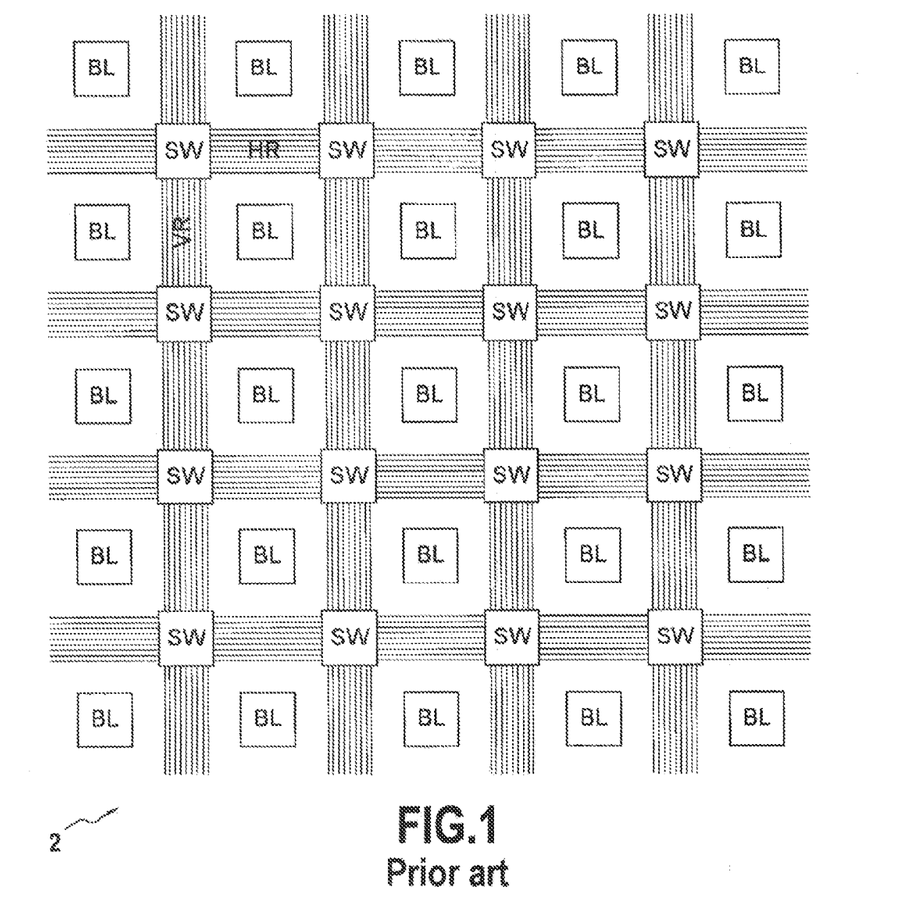
FIG. 1, described above, is a diagrammatic representation of the known architecture of a first programmable interconnection circuit.

FIG. 1 is a diagram of a conventional architecture known as "Manhattan" (or two-dimensional (2D)) for a programmable interconnection circuit 2 in which the logic blocks BL are positioned regularly in rows and columns. The programmable interconnections are made by sets of horizontal and vertical conductor tracks HR and VR, and by switch blocks SW suitable for making programmable interconnections between said conductor tracks. The switch blocks SW are regularly arranged in rows and columns so as to be interleaved between the rows and columns of the logic blocks BL.

The type of network shown in FIG. 1 nevertheless requires a large number of conductors and thus a large amount of space for providing sufficient effectiveness. The term "effectiveness" is used to mean the ability of a structure to be programmed to reproduce the interconnections needed for a given application without blocking and regardless of complexity.

A "Manhattan" network becomes relatively ineffective and bulky as the number of logic blocks increases. Although it is true that propagation times in such networks are generally acceptable for logic blocks that are spatially close together, it should nevertheless be observed that such propagation times become less and less satisfactory as the distance between logic blocks increases, with this being explained in particular by the increasing number of switch blocks SW through which it is necessary to pass in order to convey a signal.

Figure 2:
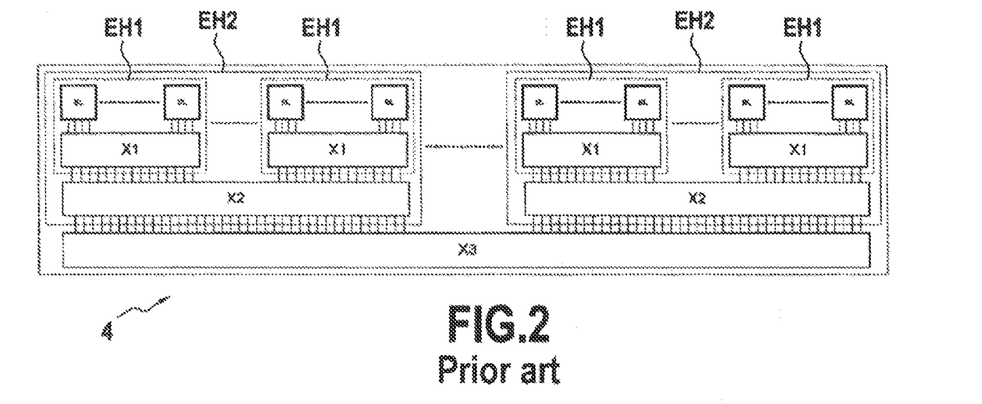
FIG. 2, described above, is a diagrammatic representation of the known architecture of a second programmable interconnection circuit.

FIG. 2 shows a known architecture for another programmable interconnection circuit 4 in which the logic blocks BL are grouped together as a plurality of sets EH1 in a first hierarchical level. By way of example, each set EH1 may constitute a functional block.

In this example, the logic blocks BL are interconnected by a network of matrices X1 referred to as "crossbars", these matrices serving to provide interconnections between the logic blocks BL and the inputs/outputs of the first hierarchical level.

The sets EH1 of the first hierarchical level are grouped together in a plurality of sets EH2 at a second hierarchical level. The sets EH1 are interconnected by a network of crossbars X2 providing connections between the sets EH1 and the inputs/outputs of the second hierarchical level. The circuit 4 may have as many hierarchical levels as necessary.

Once the number of logic blocks BL becomes very large, the architecture of the circuit 4 is more effective and more compact than the "Manhattan" structure shown in FIG. 1.

The propagation time characteristics of the circuit 4 are also satisfactory within a given hierarchical level, but they are severely penalized by the fact that the connections between two distinct sets within the same hierarchical level need to pass via the higher hierarchical level. Thus, two logic blocks BL can be spatially close together on the chip but far apart in time in terms of signal propagation because the two logic blocks belong to two distinct hierarchical sets.

There thus exists a need for a programmable interconnection device that presents satisfactory performance, in particular in terms of effectiveness, of signal propagation time, and of compactness on the chip.

OBJECT AND SUMMARY OF THE INVENTION

To this end, the present invention provides a programmable interconnection device, comprising:
  at least one first row of g functional blocks, each functional block having a plurality of inputs, a plurality of outputs, and a plurality of digital functions;
  at least one second row of n programmable interconnection cells, the second row being adjacent to the first row;
  a plurality of "horizontal" connections (called horizontal connections hereinafter), each horizontal connection connecting a respective programmable interconnection cell of the first row with only one other programmable interconnection cell of the second row, the cells connected together by the horizontal connection not being adjacent to each other in the second row; and
  a plurality of connection bundles, each bundle comprising at least two "transverse" connections (called transverse connections hereinafter) connecting a given programmable interconnection cell with a respective set of mutually adjacent functional blocks of the first row, with one of the blocks being situated in correspondence with said cell;

wherein the programmable interconnection cells are together suitable for interconnecting the inputs and the outputs of each functional block of the first row respectively with the outputs and the inputs of all of the other functional blocks of the first row by means of the horizontal and transverse connections.

The programmable interconnection device of the invention is advantageous in that it optimizes effectiveness for limited space and short propagation time, even when the number of functional blocks is large. The device makes it possible to connect all of the functional blocks of a given row solely via the horizontal and transverse connections (or, where appropriate, solely via the transverse connections) without propagation times suffering from an undesirable threshold effect as described with reference to FIG. 2. Two functional blocks that are spatially close together in a first row may be connected together via a minimum of connections and a minimum length of conductor.

The architecture of a device of the invention provides an optimum compromise between effectiveness, compactness, and propagation time.

In a particular embodiment, the condition n=g is satisfied.

In a variant of this particular embodiment:

the functional blocks written $F_i$ of the first row are such that each $F_i$ is arranged so as to be adjacent to $F_{i-1}$ and $F_{i+1}$, i being a natural integer in the range 1 to g;

the programmable interconnection cells written $M_j$ of the second row are such that each $M_j$ is arranged so as to be adjacent to $M_{j-1}$ and $M_{j+1}$, j being an integer lying in the range 1 to n, with $M_j$ and $F_i$ being positioned facing each other when i=j;

each horizontal connection connects a respective programmable interconnection cell $M_j$ of the second row solely with the neighboring programmable interconnection cell $M_{j+d1}$ of the second row for j lying in the range 1 to n−d1;

each connection bundle using transverse connections to connect a respective programmable interconnection cell $M_j$ of the second row respectively with each of the functional blocks $F_{j-d2}$ to $F_{j+d3}$ of the first row, or where appropriate, with only those of these blocks that exist; and d1, d2, and d3 are integers such that: d2≥1, d3≥1, 1<d1≤d2+d3+1, and g>d2+d3.

It can be understood that it is not essential for d2=d3, even thought that makes the programmable interconnection device easier to program.

In a particular variant, the following condition is satisfied:

d1=2, d2=d3=1

In a particular variant, the programmable interconnection device comprises a plurality of "local" connections connecting a respective interconnection cell $M_j$ of the second row solely with the interconnection cells $M_{j+d4}$ of the second row for j lying in the range 1 to n−d4, where d4 is such that 1≤d4<d1.

These local connections serve advantageously to optimize the path (i.e. the routing) needed through the network in order to connect together two functional blocks F, and thus to further reduce the propagation time in the programmable interconnection device.

Adding local connections also provides greater flexibility for routing interconnections in the device, since a plurality of routing options are thus made possible.

In a particular implementation, d4=1, thereby advantageously enabling the algorithm for programming the interconnection network of the device 6 to be simplified. This choice serves in particular to avoid undesirable go-and-return paths in the second cell row(s) that might be found to be necessary in order to interconnect two functional blocks when d4>1 (still with d4<d1).

In a particular embodiment, d1=5, d2=d3=2, and d4=1.

In another embodiment, d1=7, d2=d3=3, and d4=1.

In a particular embodiment, the programmable interconnection device comprises a plurality of said first and second rows arranged in alternation, the device further having a plurality of "vertical" connections connecting each programmable interconnection cell $M_j$ of a first row with the corresponding cells $M_j$ of an adjacent first row.

In a particular variant, where d2=d3, the programmable interconnection device comprises:

a first additional transverse connection combined with each of the transverse connections respectively connecting the programmable interconnection cells $M_j$ and the functional blocks $F_i$, for each pair [i,j] with i and j each lying in the range 1 to d2, except when (d2+1−i)<j; and a second additional transverse connection combined with each of the transverse connections respectively connecting the programmable interconnection cells $M_j$ and the functional blocks $F_i$, for each pair [i,j] with i and j each lying in the range n−d3+1 to n, except when (d3−1−n+1)<(n−j);

such that a constant number of transverse connections connect all of the programmable interconnection cells of the second row to the functional blocks of the first row.

It is thus possible to add additional transverse connections to one or more cells M situated at the ends of each second row in order to maintain a constant total number of transverse connections allocated to each cell M of said second row. This advantageously takes advantage of all of the inputs and outputs of the cells M that were initially unused because of the absence of certain functional blocks at the ends of each first row.

In a particular embodiment, each of the functional blocks has a programmable interconnection network enabling connections to be made by programming between the inputs, the outputs, and the digital functions of said functional block.

In a particular embodiment, each of said connections (i.e. horizontal, transverse, and where present local and/or vertical) comprises two connection wires serving respectively to provide communication from an output of a first programmable interconnection cell to an input of a functional block or of a second programmable interconnection cell, and also communication between an output of said functional block or of said second programmable interconnection cell and an input of said first programmable interconnection cell.

The present invention also provides an FPGA component including a programmable interconnection device according to any of the embodiments or variants defined above.

BRIEF DESCRIPTION OF THE DRAWINGS

Other characteristics and advantages of the present invention appear from the following description made with reference to the accompanying drawings which show an embodiment having no limiting character. In the figures.

DETAILED DESCRIPTION OF EMBODIMENTS

The present invention relates to the field of integrated circuits and it bears more particularly on the architecture of a programmable interconnection device and on the application of such a device to programmable logic circuits such as FPGA components.

A first embodiment of the invention is described below with reference to FIGS. 3 and 4.

Figure 3:
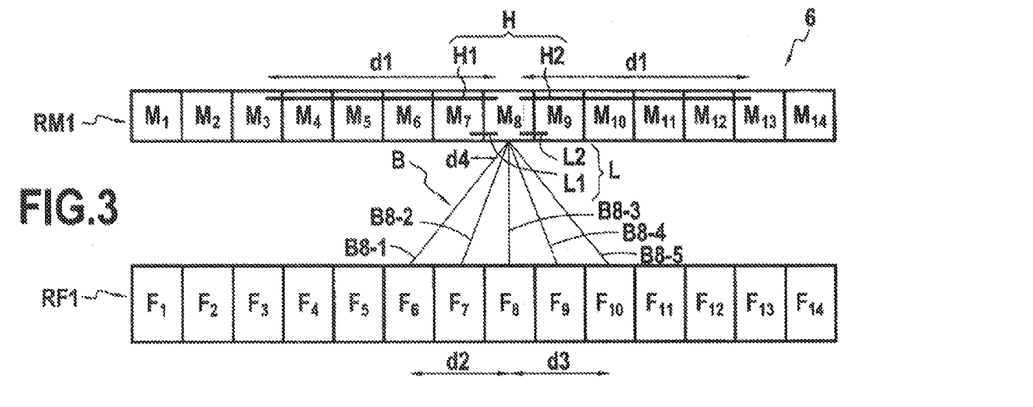
FIG. 3 is a diagram showing the individual architecture of a programmable interconnection device in a first embodiment of the invention.

More precisely, FIG. 3 shows the individual architecture of a programmable interconnection device 6 in accordance with a first embodiment of the invention.

In this example, the programmable interconnection device 6 comprises:
- a first row RF1 of g functional blocks referenced respectively $F_i$, where the rank i is an integer lying in the range 1 to g; and
- a first row RM1 of n programmable interconnection cells respectively referenced $M_j$, where the rank j is an integer lying in the range 1 to n.

In this particular example, it is assumed that g≥3 and n≥2.

In this document, the functional blocks and the programmable interconnection cells are referenced more generally F and M respectively when there is no need to refer to their ranks.

In this example, the rows RF1 and RM1 are arranged adjacent to each other.

It should be observed that in the examples envisaged in this document, the numbers n and g of the rows RM1 and RF1 are equal (n=g). Nevertheless, it should be understood that it is not essential for n and g to be equal in order to perform the invention. The presently considered example has n=g=14. Other values may naturally be selected for n and g.

Each cell $M_j$ and each block $F_i$ possesses a rank that corresponds respectively to the value of j and to the value of i. The distance (or spacing) between two programmable interconnection cells $M_j$ (and likewise between two functional blocks $F_i$) in a given row is the difference of the higher rank minus the lower rank for the two programmable interconnection cells (and likewise for the two functional blocks).

Only one row of programmable interconnection cells M and one row of functional blocks F are shown herein. Nevertheless, it should be understood, in particular from FIG. 4, that a programmable interconnection device in the meaning of the invention may comprise a plurality of rows of cells M and a plurality of rows of functional blocks F, each row of blocks F being positioned between two rows of cells M.

In this document, it should be observed that each block $F_i$ is arranged so as to be adjacent to blocks $F_{i-1}$ and $F_{i+1}$ in the same row (where i is a natural integer in the range 1 to g), or else, where applicable, so as to be adjacent to that one of $F_{i-1}$ and $F_{i+1}$ that exists. At the ends of the row, blocks $F_1$ and $F_g$ are each adjacent to only one neighboring functional block, specifically blocks $F_2$ and $F_{g-1}$ respectively.

Likewise, each cell $M_j$ is arranged so as to be adjacent to cells $M_{j-1}$ and $M_{j+1}$ in the same row (where j is a natural integer in the range 1 to n), or else, where appropriate, to be adjacent to that one of cells $M_{j-1}$ and $M_{j+1}$ that exists. At the ends of the row, cells $M_1$ and $M_2$ are each adjacent to only one neighboring programmable interconnection cell, specifically cells $M_2$ and $M_{n-1}$ respectively.

A cell $M_j$ and a functional block $F_i$ are positioned correspondingly (i.e. facing each other) when i=j.

Each functional block F comprises electronic circuits for performing logic functions. A block F may be in the form of a programmable logic functional block or in any other form that is more appropriate for implementing the desired function(s) (memory function, digital signal processing (DSP) function, processing dedicated to a specific use, . . . ). Examples of structures for functional blocks within the meaning of the invention are described in greater detail below with reference to FIGS. 8A to 8D.

Each of the functional blocks F may comprise:
- a plurality of inputs;
- a plurality of outputs;
- a plurality of digital electronic functions; and
- a programmable interconnection network suitable for interconnecting the inputs and the outputs of said digital electronic functions. By way of example, such a network may comprise crossbar type matrices or Clos type networks.

In the presently-envisaged examples, each functional block F is suitable for permutating its inputs among one another and for permutating its outputs among one another.

The programmable interconnection cells M of the row RM1 serve to provide the interconnections in the device 6 between the inputs and the outputs of the functional blocks F of the neighboring row RF1. To do this, the cells M are configured to switch signals via a set of point-to-point electrical connections that are fixed within the programmable interconnection device. In other words, each of these electrical connections forms an (electrically conductive) link that is physically established in permanent manner in the programmable interconnection device, these connections enabling data signals to be exchanged in at least one direction. Each connection may have a plurality of connection wires (or tracks). The cells M connect together the electrical connections appropriate for making links between two given functional blocks.

In accordance with the invention, the programmable interconnection device 6 has a plurality of "horizontal" connections H, each of these connections connecting a respective programmable interconnection cell M of the row RM1 with only one other programmable interconnection cell M of the same row. The cells M that are connected together by these horizontal connections are not adjacent to one another in the row in question. In other words, for each pair of (non-adjacent) cells M that are connected together by a horizontal connection H, there exists at least one intermediate cell M positioned between the two cells that are connected together in this way. The horizontal connection does not connect with the cell(s) M that is/are intermediate between the two cells M of the pair in question.

In the presently-envisaged example, the cell $M_8$ is connected to the cells $M_3$ and $M_{13}$ via respective horizontal connections H1 and H2 (and referenced more generally H).

In this example, the horizontal connections H are such that the same number of intermediate cells M exists between each pair of cells M connected together by the horizontal connections H.

In this example, four programmable interconnection cells are present between each pair of cells M that are connected together by the same horizontal connection H. It is considered tah the distance dl between the two cells M of each pair connected together by a horizontal connection H is such that d1=5. It is naturally possible to select other values for d1.

Each horizontal connection H thus connects a respective programmable interconnection cell $M_j$ of the row RM1 solely with the neighboring programmable interconnection cell $M_{j+d1}$ in the same row RM1 for j lying in the range 1 to n–d1.

For reasons of clarity, only the horizontal connections H connecting the cell $M_8$ are shown in FIG. 3. It can be understood that the device 6 includes in the row RM1 all of the horizontal connections H that can connect together two non-adjacent cells M situated at the distance dl apart from each other.

In the example of FIG. 3, the programmable interconnection cells $M_6$, $M_7$, $M_8$, and $M_9$ are each connected via two horizontal connections H to two cells M situated on either side of them at the distance d1 in the row RM1. In contrast, at the ends of the row RM1, the cells $M_1$ to $M_5$ at one end and the cells $M_{10}$ to $M_{14}$ at the other end are connected to only one non-adjacent cell M situated at the distance dl apart therefrom. The sole horizontal connection connecting $M_3$ corresponds in this example to one of the horizontal connections connected to $M_8$.

In accordance with the invention, the programmable interconnection device 6 also has a plurality of connection bundles B, each bundle having at least two transverse connections B connecting a given programmable interconnection cell M of the row RM1 with respective sets of functional blocks F in the row RF1 that are adjacent to each other, one of these blocks F being situated in correspondence with said cell M. The transverse connections B thus enable each cell M of a first row to be connected with functional blocks F of a second row that is adjacent to the first row.

A respective bundle of transverse connections B connects each cell M of the row RM1 with functional blocks of the row RF1.

In this first embodiment, the programmable interconnection cell $M_8$ is connected via the transverse connections B8-1, B8-2, B8-3, B8-4, and B8-5 (referred to collectively as B8) with the respective functional blocks $F_6$, $F_7$, $F_8$, $F_9$, and $F_{10}$ of the row RF1.

For reasons of clarity, only the transverse connections B connecting the cell $M_8$ are shown in FIG. 3. It should nevertheless be understood that a bundle of transverse connections B connects each cell M of the row RM1 with neighboring functional blocks of the row RF1.

In a particular implementation of the invention, each bundle B uses distinct transverse connections to connect a respective programmable interconnection cell $M_j$ of the row RM1 with respective ones of the functional blocks $F_{j-d2}$ to $F_{j+d3}$ (j lying in the range 1 to n) of the row RF1, or where appropriate, with only those of these blocks that exist.

Specifically, concerning the cells $M_1$ to $M_{d2-1}$ and the cells $M_{g-d3+1}$ to $M_g$, one or more functional blocks in the range $F_{j-d2}$ to $F_{j+d3}$ do not exist. Ignoring these particular situations, each bundle of transverse connections B serves to connect a cell $M_j$ with the functional block $F_j$ situated facing it (i.e. when i=j) and also with the functional block $F_i$ situated at a distance from $F_j$ that is less than or equal to d2 and d3 respectively on either side in the same row (where d2 and d3 are natural integers).

In accordance with the invention, the device 6 is configured so that all of the programmable interconnection cells M of a given row (i.e. the row RM1 in this example) are suitable for being programmed to interconnect the inputs and the outputs of each functional block F of an adjacent row (i.e. in this example the row RF1) with respective outputs and inputs of all of the other functional blocks F of said adjacent row (RF1), via horizontal and transverse connections H and B.

In the presently-described first embodiment, the following conditions are satisfied, for example:
 a) $d2 \geq 1$;
 b) $d3 \geq 1$;
 c) $1 < d1 \leq d2 + d3 + 1$; and
 d) $g > d2 + d3$.

In this example, n=g, so the following condition is also satisfied:

$$n > d2 + d3$$

Complying with the conditions a), b), c), and d) makes it possible, for example, to interconnect at will any of the functional blocks of the row RF1 via the above-described horizontal and transverse connections H and B.

FIG. 3 shows the particular configuration in which d1=5 and d2=d3=2.

It should be understood that it is not essential for d2=d3, although that does facilitate programming the programmable interconnection device 6.

The programmable interconnection device of the invention is advantageous in that it provides optimum effectiveness for limited space and short propagation time even when the number of functional blocks is large. The device makes it possible to interconnect all of the functional blocks of a given row solely via the horizontal and transverse connections (or where appropriate via the transverse connections only) without propagation times suffering from an undesirable threshold effect as described with reference to FIG. 2. Two functional blocks F that are spatially close together in a given row can be connected together via a minimum of connections and a minimum length of conductor.

The architecture of the device of the invention provides an optimum compromise between effectiveness, compactness, and propagation time.

In order to illustrate the way in which the device 6 can be configured, consideration is given below to an example in which it is desired to connect an input of the functional block $F_6$ electrically to an output of the functional block $F_{12}$. The use of the bundle B8 on its own does not suffice for connecting together the blocks $F_6$ and $F_{12}$ in the particular configuration shown in FIG. 3 where d2=d3=2. It is therefore necessary to set up the electrical link via the cell $M_{13}$, for example. To do this, the cell $M_8$ is configured to connect together the transverse connection B8-1 to the horizontal connection H2. The cell $M_{13}$ is also configured to connect the horizontal connection H2 to the transverse connection (referenced B13-2) that is physically present between the cell $M_{13}$ and the functional block $F_{12}$.

Furthermore, although not essential, the structure 6 may also include a set of local connections L connecting each interconnection cell $M_j$ of the row RM1 solely with the interconnection cell $M_{j+d4}$ of the same row RM1, for j lying in the range 1 to n–d4 (FIG. 3).

The distance d4 is such tah $1 \leq d4 < d1$.

In FIG. 3, consideration is given to the configuration in which d4=1. In this configuration, local connections (or "local horizontal connections") L1 and L2 are respectively present firstly between the cells $M_7$ and $M_8$, and secondly between the cells $M_8$ and $M_9$. For reasons of clarity, the other local connections L interconnecting each other pair of cells M are not shown in FIG. 3.

The local connections L serve advantageously to optimize the path needed for connecting together two functional blocks F, and thus to further reduce propagation time in the programmable interconnection device.

Returning to the above-mentioned example, the functional blocks $F_6$ and $F_{12}$ can be interconnected by configuring the cells $M_8$, $M_9$, and $M_{10}$ in such a manner as to connect together in succession: the transverse connection B8-1, the two local connections situated between $M_8$ and $M_9$ and between $M_9$ and $M_{10}$, and the transverse connection B10-5 physically connecting the cell $M_{10}$ and the functional block $F_{12}$. This alternative configuration serves to reduce the propagation time for signals between the blocks $F_6$ and $F_{12}$ compared with the above-described path involving the horizontal connection H2.

The particular choice of d4=1 serves advantageously to simplify the algorithm for programming the interconnection network of the device 6. This choice makes it possible in particular to avoid undesirable go-and-return paths within the row RM1, as might turn out to be necessary for connecting together two functional blocks when d4>1 (still with d4<d1).

Adding local connections L also provides greater flexibility for routing interconnections in the device, since a plurality of routing options are then possible.

The Applicant has found that the following configurations make it possible to obtain optimum performance:
    d1=5, d2=d3=2, d4=1; or
    d1=7, d2=d3=3, d4=1.

As mentioned above, the programmable interconnection device 6 may have a plurality of rows of cells M and a plurality of rows of functional blocks F, each row of blocks F being positioned between two rows of cells M. In other words, for p rows of blocks F, the device 6 has p+1 rows of cells M alternating between the rows of blocks F (p being an integer such that p>1).

Figure 4:
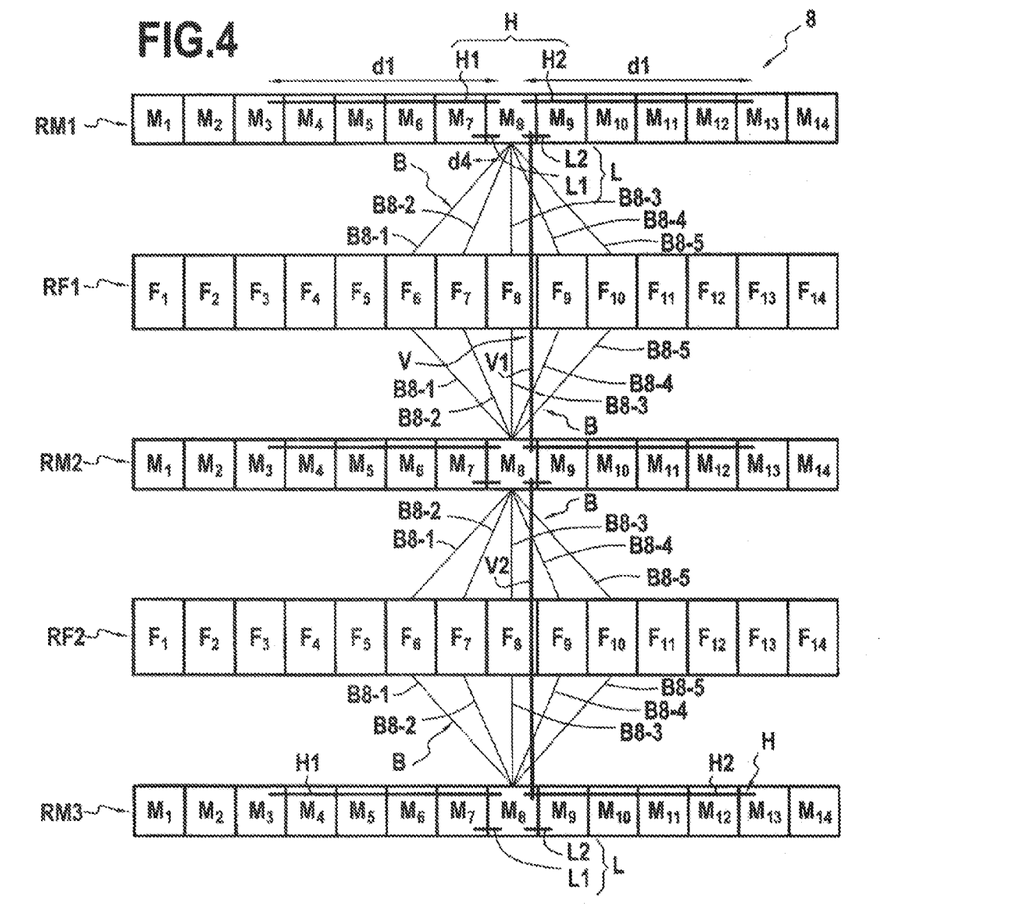
FIG. 4 is a diagram showing a programmable interconnection device in the first embodiment of the invention.

FIG. 4 shows an example in which the programmable interconnection device 6 has an additional row RF2 of functional blocks F and two additional rows RM2 and RM3 of programmable interconnection cells M. For reasons of clarity, the programmable interconnection device is renamed 8.

The rows RM1, RM2, and RM3 alternate so that each row of blocks F lies between two rows of cells M. Nevertheless, it is also possible to imagine that there are as many rows of blocks F as there are rows of cells M.

Each of the rows RM2 and RM3 has horizontal connections H and local connections L identical to those described above with reference to the row RM1. As already explained above, the inclusion of local connections L is nevertheless not essential.

Furthermore, transverse connection bundles B as described above with reference to FIG. 3 are present between each cell M and the adjacent row(s) of functional blocks F.

For reasons of clarity, only the connections connected to programmable interconnection cells and functional blocks of rank 8 are shown in the figure. By way of example, it can be seen that the cells M of the row RM2 are connected via two transverse connection bundles B to functional blocks situated respectively in the two adjacent rows RF1 and RF2.

Furthermore, in the particular configuration in which there are a plurality of rows of programmable interconnection cells (as shown for example in FIG. 4), the device 6 may also have a plurality of "vertical" connections V connecting each programmable interconnection cell $M_j$ of one row with the corresponding cells $M_j$ of an adjacent row. It is thus possible to interconnect in pairs all of the cells $M_j$ of the same rank situated in the various rows of programmable interconnection cells.

For example, in FIG. 4, the cell $M_8$ of the row RM2 is physically connected to the cells of the same rank in rows RM1 and RM2 via respective vertical connections V1 and V2. Each cell $M_j$ of the row RM2 is thus connected to the corresponding cells $M_j$ of the adjacent rows RM1 and RM2 via analogous vertical connections (not shown in the figure for reasons of clarity).

The structure of the presently-described device can thus be applied to a very large number of rows and to a very large number of cells M and of functional blocks F per row. The values of the parameters d1, d2, d3 (and possibly d4), n, and g, and also the numbers of rows of cells M and of functional blocks F can be adapted depending on the requirements specific to each application.

Figure 5A:
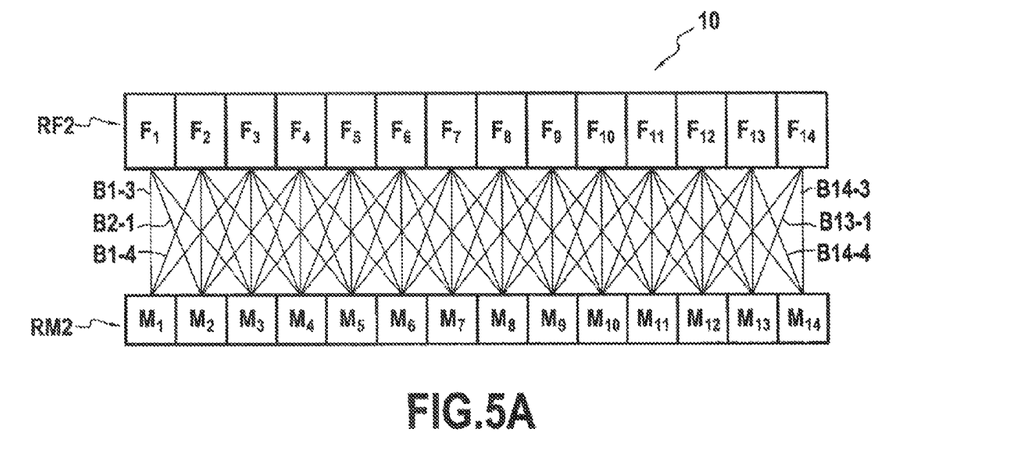
FIGS. 5A and 5B show a first variant of the first embodiment shown in FIGS. 3 and 4.
Figure 5B:
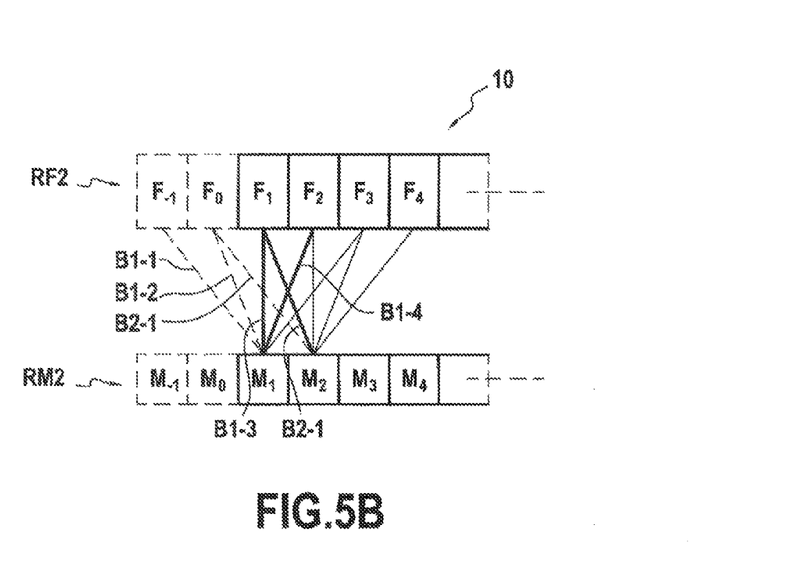

By way of example, FIGS. 5A and 5B are diagrams showing all of the transverse connections physically connecting together the functional blocks F of the row RF2 and the programmable interconnection cells M of the row RM2 of the device 6. As mentioned above, certain transverse connections B are absent at the two ends of the structure (reference 10).

More precisely, in the presently-described implementation, each connection bundle B uses transverse connections B to connect a respective programmable interconnection cell $M_j$ of the row RM2 with each of the functional blocks $F_{j-d2}$ to $F_{j+d3}$ (j lying in the range 1 to n) of the row RF2, or where appropriate, with only those of these blocks that exist. Concerning the cells $M_1$ to $M_{d2-1}$ and the cells $M_{g-d3+1}$ to $M_g$, one or more functional blocks in the range $F_{j-d2}$ to $F_{j+d3}$ do not exist.

In the particular configuration in which d2=d3=2 and n=g=14, the connection bundles B from the cells $M_1$, $M_2$, $M_{13}$, and $M_{14}$ are partially truncated because of the absence of functional blocks to the left of $F_1$ or to the right of $F_{14}$. FIG. 5B shows by way of example in dashed lines:
    the functional blocks $F_{-1}$ and $F_0$ that are missing to the left of the block $F_1$;
    the transverse connections B1-1 and B1-2 that ought theoretically to connect $M_1$ to $F_{-1}$ and $F_0$, respectively; and
    the transverse connection B2-1 that ought theoretically to connect $M_2$ to $F_0$.

In a particular variant where d2=d3, the device may further comprise:
    a first additional transverse connection combined with each of the transverse connections B respectively connecting the programmable interconnection cells $M_j$ and the functional blocks $F_i$ for each pair [i,j] with i and j each lying in the range 1 to d2, except when (d2+1−i)<j; and
    a second additional transverse connection combined with each of the transverse connections respectively connecting the programmable interconnection cells $M_j$ and the functional blocks $F_i$ for each pair [i,j] with i and j each lying in the range n−d3+1 to n except when (d3−1−n+i) <(n−j);
such that a constant number of transverse connections B connect all of the programmable interconnection cells M of the second row to the functional blocks of the first row.

By way of example, configuration of FIG. 5B is missing two transverse connections (B1-1 and B1-2) connected to the cell $M_1$ and one transverse connection (B2-1) connected to the cell $M_2$. It is thus advantageous to connect two additional transverse connections to the cell $M_1$ and one additional transverse connection to the cell $M_2$ in order to maintain a constant total number of five transverse connections allocated to each cell M of the row RM2. Advantage is thus advantageously taken of all of the inputs and outputs of the cells $M_1$ and $M_2$ that would otherwise be unused as a result of the absence of $F_{-1}$ and $F_0$.

In a particular implementation, the transverse connections B1-3 and B1-4 connected to the cell $M_1$ and the transverse connection B2-1 connected to the cell $M_2$ are duplicated. In other words, an additional transverse connection is added to each of the transverse connections B1-3, B1-4, and B2-1. Analogous duplication of the transverse connections may be implemented at the other end of the structure 10.

Figure 6:
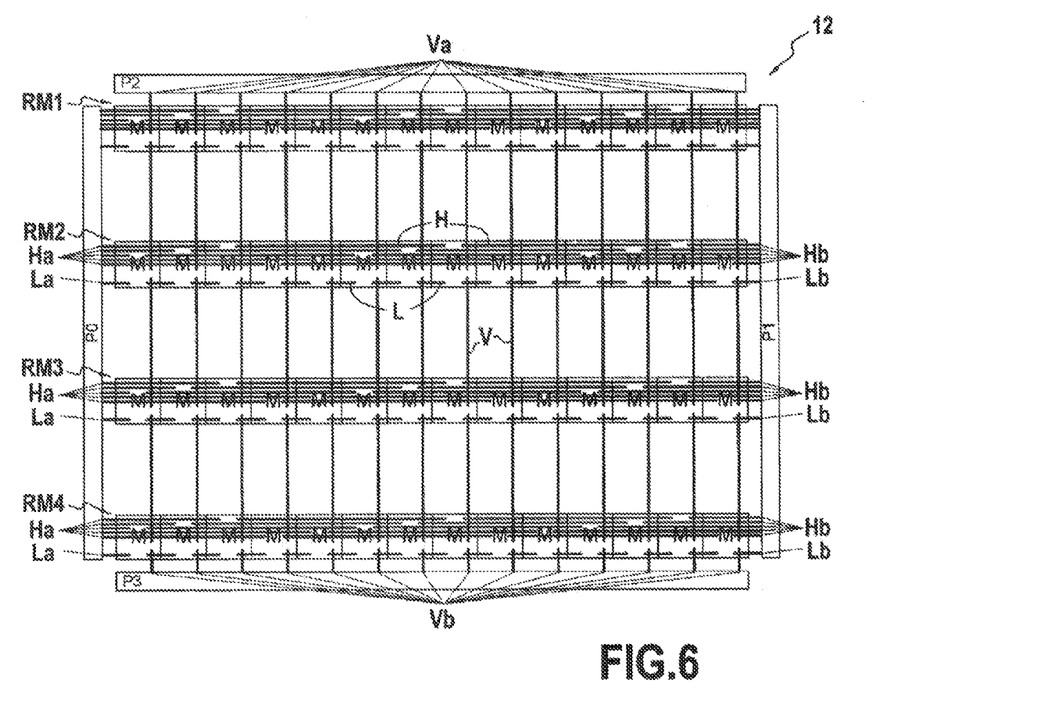
FIG. 6 is a diagram showing a second variant of the first embodiment of the invention.

FIG. 6 shows the example of a structure 12 having four rows (referenced respectively RM1, RM2, RM3, and RM4) of programmable interconnection cells M arranged in alternation with three rows of functional blocks F. For reasons of clarity, the rows of blocks F and the transverse connections B are not shown in this figure even though they exist in practice.

In the configuration shown in FIG. 6, the following parameters have been selected:
d1=5;
d4=1;
n=g=14.

FIG. 6 shows all of the horizontal connections H, of the local connections L, and of the vertical connections V interconnecting the programmable interconnection cells M of the structure 12 (even though the connections L, and where applicable the connections V, are not essential as mentioned above).

For each row of cells M, the structure 12 also includes additional horizontal connections Ha and Hb connecting the calls M situated at the ends of the row with peripheral blocks P0 and P1.

In a particular implementation, the cells $M_1$ to $M_{d1-1}$ are each connected by a respective additional connection Ha with the neighboring peripheral block P0. Likewise, the cells $M_{n-d1+1}$ to $M_n$ are each connected by a respective horizontal connection Hb with the neighboring peripheral block P1.

The structure 12 may also have two additional local connections La and Lb respectively connecting the cells $M_1$ and $M_n$ of each row with the respective peripheral blocks P0 and P1.

The structure 12 may also have two additional vertical connections Va and Vb respectively connecting each cell M of the row RM1 to a neighboring peripheral block P2 and each cell M of the row RM4 to a neighboring peripheral block P3.

In a particular embodiment, each of the transverse connections comprises two connection wires serving to provide communication respectively between an output of a programmable interconnection cell to an input of a functional block and also communication from an output of said functional block to an input of said programmable interconnection cell.

Figure 7:
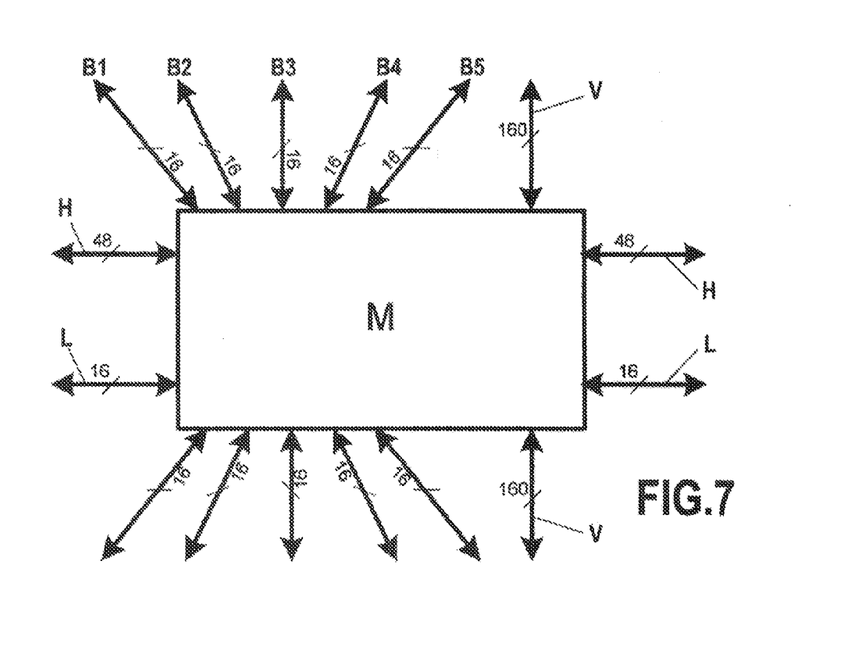
FIG. 7 shows a configuration example for connections made using a given programmable interconnection cell.

FIG. 7 shows an example of a configuration for connections between a programmable interconnection cell M and a functional block F. In this configuration, each of the connections H has 48 up connection wires and 48 down connection wires, i.e.:
48 wires connecting 48 inputs of a cell M to 48 outputs of another cell M situated at a distance d1; and
48 wires connecting 48 outputs of a cell M to 48 inputs of another cell M situated at a distance d1.

Likewise, each additional connection L has 16 up connection wires and 16 down connection wires. Each additional connection V has 160 up connection wires and 160 down connection wires. Each of the transverse connections B1 to B10 (where (1+d2+d3)=5) possesses 16 up connection wires and 16 down connection wires.

As mentioned above, each additional block F of the programmable interconnection device of the invention has electronic circuits for performing logic functions. A block F may be in the form of a programmable logic functional block or any other form better adapted to performing the desired function(s). Examples of structures for functional blocks in the meaning of the invention are described briefly with reference to FIGS. 8A to 8D.

As already explained, each functional block may comprise:
a plurality of inputs;
a plurality of outputs;
a plurality of digital electronic functions; and
a programmable interconnection network suitable for interconnecting the inputs and the outputs of said digital electronic functions.

In the example envisaged in this document, each functional block F is suitable for permutating its inputs among one another and it is also suitable for permutating its outputs among one another.

In a particular embodiment, each of the functional blocks F of the programmable interconnection device of the invention comprises a programmable interconnection network enabling connections to be established programmatically between the inputs, the outputs, and the digital functions of said functional block.

Figure 8A:
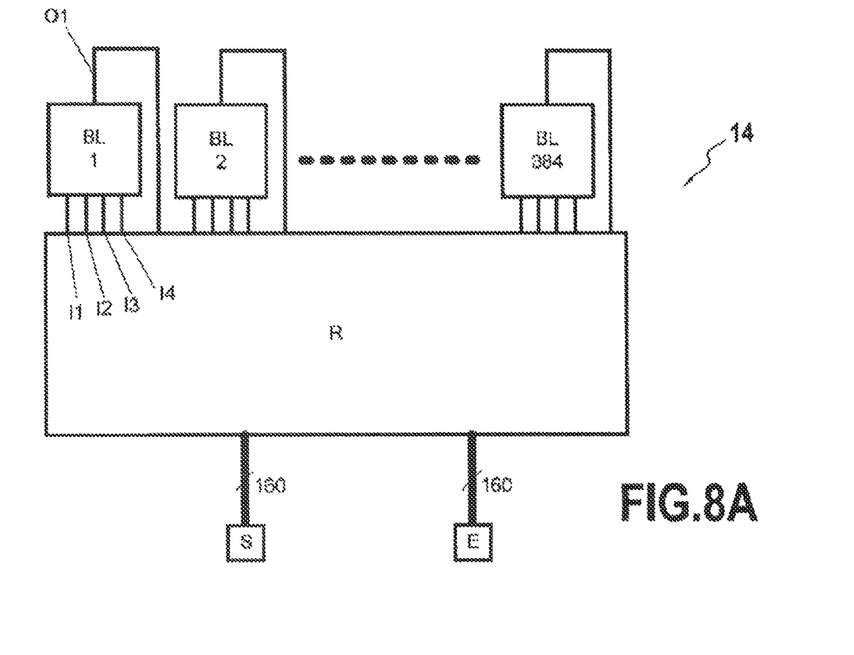
FIGS. 8A, 8B, 8C, and 8D show examples of structures for functional blocks in the meaning of the invention.

FIG. 8A shows a first example of a structure (reference 14) for a functional block, this structure 14 comprising:
a set of f logic blocks BL each identified by a rank in the range 1 to f, each logic block having m inputs I, each identified by a different rank in the range 1 to m, and o outputs O, each identified by a different rank in the range 1 to o. The f logic blocks BL serve to perform the combinational and/or sequential functions of a given scheme;
a set of e inputs E, each identified by a different rank in the range 1 to e;
a set of s outputs S, each identified by a different rank in the range 1 to s; and
a programmable interconnection network R serving to make connections between the f logic blocks, the e inputs E, and the s outputs S.

FIG. 8A shows the particular configuration in which: e=s=160, f=384, m=4, and o=1. In this example, the four inputs of the logic block BL1 are referenced I1 to I4 and the output of BL1 is referenced O1.

Figure 8B:
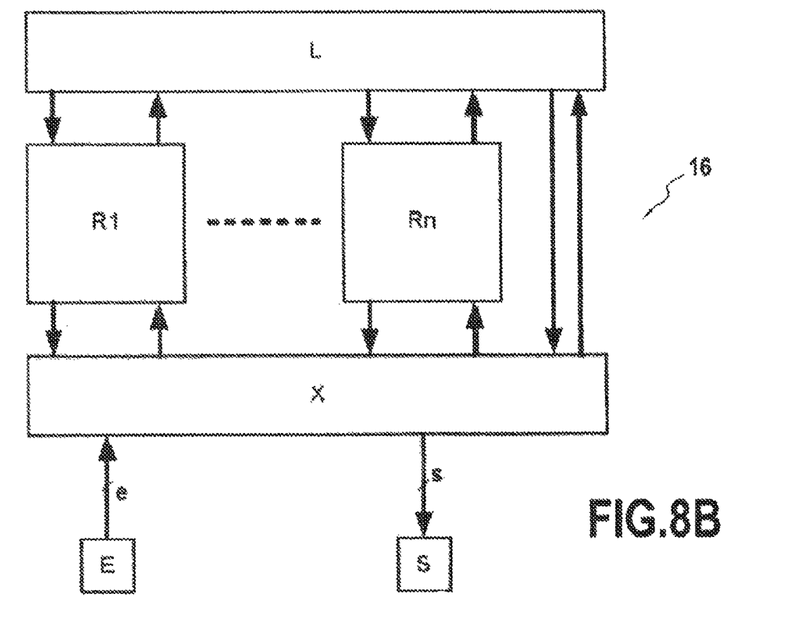

FIG. 8B shows a second example structure (reference 16) for a functional block, this structure 16 comprising:
a set S of s outputs;
a set E of e inputs;
a set of n functions R of the static memory (SRAM) type referenced R1 to Rn, these functions possessing one or more read and write ports;
a logic function L having logic gates and registers;
a network of crossbars X;
interconnections between the SRAM functions R and the logic function L;
interconnections between the SRAM functions R and the network of crossbars X;
interconnections between the logic function L and the network of crossbars X;
interconnections between the inputs E and the network of crossbars X; and
interconnections between the outputs S and the network of crossbars X.

The inputs E and the outputs S are connected to the network of programmable interconnection cells M.

Figure 8C:
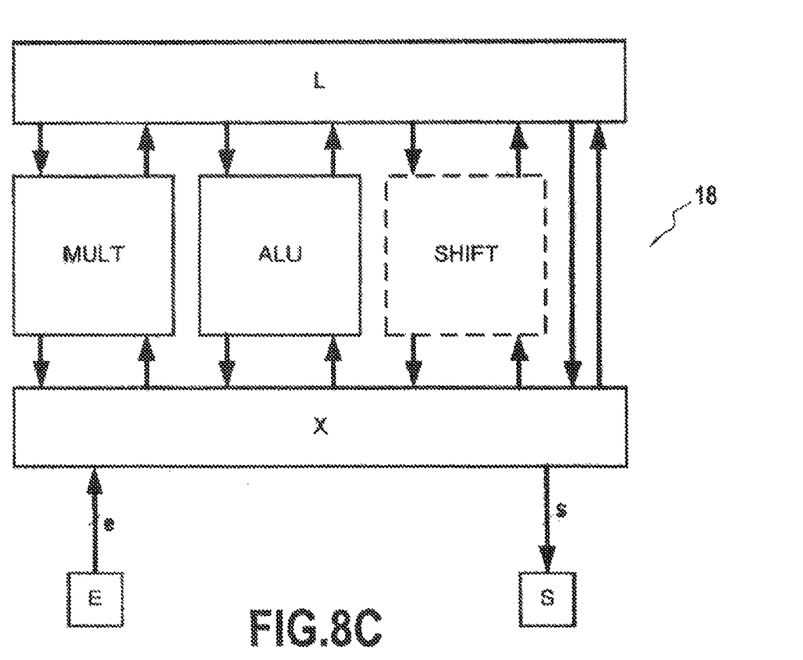

FIG. 8C shows a third example of a structure (reference 18) for a functional block, this structure 18 comprising:
  a set S of s outputs;
  a set E of e inputs;
  at least one multiplier type function MULT;
  at least one arithmetic and logic unit type function ALU capable of performing operations requiring carry propagation or Boolean operations on operands of width greater than 1;
  optionally additional functions such as an arithmetic or logic shift function SHIFT;
  a logic function L comprising logic gates and registers;
  a network of crossbars X;
  interconnections between the functions MULT, ALU, SHIFT and the logic function L;
  interconnections between the functions MULT, ALU, SHIFT, and the network of crossbars X;
  interconnections between the logic function L and the network of crossbars X;
  interconnections between the inputs E and the network of crossbars X; and
  interconnections between the outputs S and the network of crossbars X.

The inputs E and the outputs S are connected to the network of programmable interconnection cells M.

Figure 8D:
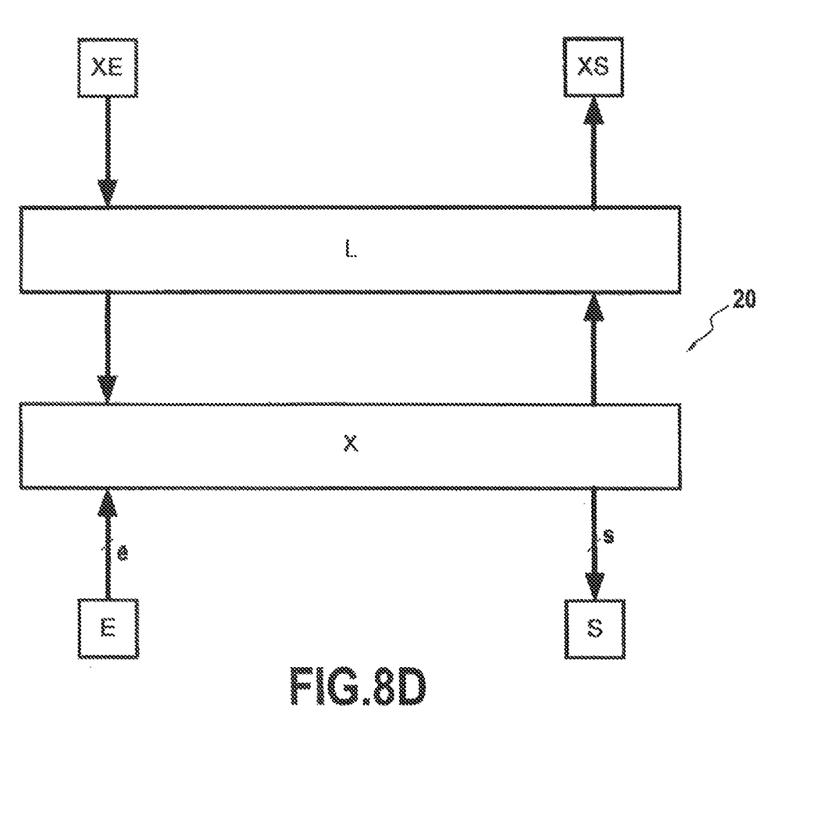

FIG. 8D shows a fourth example of a structure (reference 20) for a functional block, this structure 18 comprising:
  a set S of s outputs;
  a set E of e inputs;
  optionally a set XE of dedicated inputs (connections that are different from the horizontal, vertical, and local connections as described above);
  optionally a set XS of dedicated outputs (connections that are different from the horizontal, vertical, and local connections as described above);
  a logic function L comprising logic gates and registers performing digital processing of signals coming from the inputs E and XE, this logic function L generating a result that it delivers via signals on the outputs S and XS;
  a network of crossbars X;
  interconnections between the logic function L and the network of crossbars X;
  interconnections between the logic function L and the dedicated inputs XE;
  interconnections between the logic function L and the dedicated outputs XS;
  interconnections between the inputs E and the network of crossbars X; and
  interconnections between the outputs S and the network of crossbars X.

The inputs E and the outputs S are connected to the network of programmable interconnection cells M. The inputs XE and the outputs XS are connected to some other portion of the integrated circuit.

The person skilled in the art will understood that the embodiments and variants described above merely constitute non-limiting examples of how the invention can be implemented. In particular, the person skilled in the art can envisage any combination of the above-described variants and embodiments in order to satisfy some particular need.

The present invention also provides an FPGA component including a programmable interconnection device in the meaning of the invention, e.g. in one of the above-described embodiments or variants.

The invention claimed is:

1. A programmable interconnection device, comprising:
  at least one first row of g functional blocks, each functional block having a plurality of inputs, a plurality of outputs, and a plurality of digital functions;
  at least one second row of n programmable interconnection cells, said second row being adjacent to said first row;
  a plurality of horizontal connections, each horizontal connection connecting a respective programmable interconnection cell of the first row with only one other programmable interconnection cell of said second row, said cells connected together by said horizontal connection not being adjacent to each other in the second row; and
  a plurality of connection bundles, each bundle comprising at least two transverse connections connecting a given programmable interconnection cell with a respective set of mutually adjacent functional blocks of the first row, with one of said blocks being situated in correspondence with said cell;
  wherein the programmable interconnection cells are together suitable for interconnecting the inputs and the outputs of each functional block of said first row respectively with the outputs and the inputs of all of the other functional blocks of said first row by means of said horizontal and transverse connections.

2. A device according to claim 1, wherein n=g.

3. A device according to claim 1, wherein:
  the functional blocks written $F_i$ of the first row are such that each $F_i$ is arranged so as to be adjacent to $F_{i-1}$ and $F_{i+1}$, i being a natural integer in the range 1 to g;
  the programmable interconnection cells written $M_j$ of the second row are such that each $M_j$ is arranged so as to be adjacent to $M_{j-1}$ and $M_{j+1}$, j being an integer lying in the range 1 to n, with $M_j$ and $F_i$ being positioned facing each other when i =j;
  each horizontal connection connects a respective programmable interconnection cell $M_j$ of the second row solely with the neighboring programmable interconnection cell $M_{j+d1}$ of said second row for j lying in the range 1 to n−d1;
  each bundle using transverse connections to connect a respective programmable interconnection cell $M_j$ of said second row respectively with each of the functional blocks $F_{j-d2}$ to $F_{j+d3}$ of said first row, or where appropriate, with only those of these blocks that exist; and
  d1, d2, and d3 are integers such that: d2≥1, d3≥1, 1<d1≤d2+d3+1, and g>d2+d3.

4. A device according to claim 3, wherein d1=2, d2=d3=1.

5. A device according to claim 3, comprising a plurality of local connections connecting a respective interconnection cell $M_j$ of said second row solely with the interconnection cells $M_{j+d4}$ of the second row for j lying in the range 1 to n-d4, where d4 is such that 1≤d4<d1.

6. A device according to claim 5, wherein d1=5, d2=d3=2, and d4=1.

7. A device according to claim 5, where d1=7, d2=d3=3, and d4=1.

8. A device according to claim 2, comprising a plurality of said first and second rows arranged in alternation, the device further comprising a plurality of vertical connections connecting each programmable interconnection cell $M_j$ of a first row with the corresponding cells $M_j$ of an adjacent first row.

9. A device according to claim 8, wherein d2=d3, the device comprising:
  a first additional transverse connection combined with each of said transverse connections respectively connecting the programmable interconnection cells $M_j$ and the functional blocks $F_i$, for each pair with i and j each lying in the range 1 to d2, except when $(d2+1-1)<j$; and a second additional transverse connection combined with each of said transverse connections respectively connecting the programmable interconnection cells $M_j$ and the functional blocks $F_i$, for each pair [i,j] with i and j each lying in the range n−d3+1 to n, except when $(d3-1-n+1)<(n-j)$;

such that a constant number of transverse connections connect all of the programmable interconnection cells of the second row to the functional blocks of the first row.

10. A device according to claim 1, wherein each of the functional blocks has a programmable interconnection network enabling connections to be made by programming between the inputs, the outputs, and the digital functions of said functional block.

11. A device according to claim 1, wherein each of said connections comprises two connection wires serving respectively to provide communication from an output of a first programmable interconnection cell to an input of a functional block or of a second programmable interconnection cell, and also communication between an output of said functional block or of said second programmable interconnection cell and an input of said first programmable interconnection cell.

12. An FPGA component including a programmable interconnection device according to claim 1.

* * * * *